United States Patent [19]

Wilhelm

[11] Patent Number: 5,020,926

[45] Date of Patent: Jun. 4, 1991

[54] PRINTER MOUNTING ARRANGEMENT

[75] Inventor: Joseph R. Wilhelm, Lake Oswego, Oreg.

[73] Assignee: Sejus Corporation, Lake Oswego, Oreg.

[21] Appl. No.: 535,739

[22] Filed: Jun. 8, 1990

[51] Int. Cl.[5] .......... B41J 29/38; H05K 7/16

[52] U.S. Cl. .......... 400/54; 400/682; 400/693; 361/391; 200/61.71

[58] Field of Search .......... 400/683, 120, 88, 682, 400/663, 691, 692, 693, 54; 361/390, 391, 392, 393, 394, 395, 397, 400; 200/61.58 R, 61.61, 61.62, 61.71, 61.72, 61.73; 312/7.2, 208

[56] References Cited

U.S. PATENT DOCUMENTS

| | | | |
|---|---|---|---|
| 2,980,226 | 4/1961 | Inoue | 400/654 |
| 4,238,806 | 12/1980 | Bovio et al. | 346/76 PH |
| 4,372,694 | 2/1983 | Bovio et al. | 400/54 |
| 4,493,038 | 1/1985 | Bovio et al. | 364/405 |
| 4,576,578 | 3/1986 | Parker et al. | 400/682 |
| 4,614,383 | 9/1986 | Polley et al. | 361/391 |
| 4,669,029 | 5/1987 | Svenson et al. | 361/392 |
| 4,709,972 | 12/1987 | Labudde et al. | 312/208 |
| 4,734,710 | 3/1988 | Sato et al. | 346/76 PH |
| 4,759,646 | 7/1988 | Platt | 400/88 |
| 4,788,658 | 11/1988 | Hanebuth | 400/691 |
| 4,977,532 | 12/1990 | Borkowicz et al. | 361/391 |

FOREIGN PATENT DOCUMENTS

| | | | |
|---|---|---|---|
| 0176859 | 4/1985 | European Pat. Off. | 361/390 |
| 3724620 | 2/1989 | Fed. Rep. of Germany | 361/390 |
| 0084270 | 4/1986 | Japan | 400/693 |
| 1409521 | 10/1975 | United Kingdom | 400/682 |
| 2133222 | 7/1984 | United Kingdom | 361/391 |
| 2140355 | 11/1984 | United Kingdom | 361/394 |

OTHER PUBLICATIONS

"Industrial Personal Computer for Class" C Industrial Environment IBM Tech. Discl. Bulletin, vol. 28, No. 7, 12/85 p. 2785-2798.

"Personal Computer Mobile Workstation" IBM Technical Disclosure Bulletin, vol. 27, No. 6, 11/84 p. 3488-3489.

"Memodyne Configure 404 TM Series Ready-to-Integrate Thermal Printers," Bulletin 404, 1988 Memodyne Corporation.

*Primary Examiner*—Eugene H. Eickholt

*Attorney, Agent, or Firm*—Klarquist, Sparkman, Campbell, Leigh & Whinston

[57] ABSTRACT

A printer assembly is sized with a form factor comparable to a disk drive and includes provision for mounting in a drive bay of a computer or other electronic apparatus. In one embodiment, the printer is slidable between first and second positions. In the first position, the printer is disposed within the case of the computer, concealed and secure from abuse. In the second position, the printer is disposed outside the case and is available for use. In another embodiment, the printer is fixedly mounted within the drive bay.

23 Claims, 3 Drawing Sheets

PRINTER MOUNTING ARRANGEMENT

FIELD OF THE INVENTION

The present invention relates to printers, and more particularly relates to a novel arrangement whereby a printer can be provided as an integral component of a computer or other electronic apparatus.

BACKGROUND AND SUMMARY OF THE INVENTION

A printer is a virtually essential accessory for use with a computer. In some applications, however, such as those in which the computer is of the "portable" or "transportable" type, it is awkward to provide a printer. The unit must be carried separately, and connected and disconnected from the computer and from a power source each time it is used and moved. Other printer inconveniences arise with computers that are rack mounted, and in situations in which space is limited. If the computer is rack mounted, a separate rack must usually be dedicated to the printer. If space is limited, the additional "footprint" area required by the printer can rival that required by the computer itself.

In accordance with the present invention, these problems are overcome by mounting a printer assembly within the case of a computer. In one embodiment, the printer assembly is sized and adapted for mounting in an industry standard drive bay, of the sort with which most computers are equipped. The assembly is fixedly mounted in this bay behind a front panel, and paper printed thereby is routed out an opening in the panel. In another embodiment, the printer is mounted in a recess in a computer case, such as in a drive bay, and is slidable between first and second positions. In the first position, the printer is disposed within the case, concealed and secure from abuse. In the second position, the printer is disposed outside the case and is available for use. In both embodiments, power and data connections are made internally to the printer assembly, preferably with industry-standard connectors to facilitate installation. Such a printer assembly can be provided as a component of a computer as originally manufactured, or can be added subsequently to a computer as an accessory.

The foregoing and additional features and advantages of the present invention will be more readily apparent from the following detailed description thereof, which proceeds with reference to the accompanying drawings.

DETAILED DESCRIPTION

As is familiar to those skilled in the art, computers typically are equipped with one or more "bays" into which disk or tape drives can be installed. Such bays are sized in accordance with industry standards to facilitate their use with a variety of after-market drive products. Standard dimensions are approximately 5.5 or 3.5 inches in width and 1.75 or 3.5 inches in height. "Rails" on the sides of a disk drive cooperate with support structure inside the bay to facilitate mounting of the drive in the bay.

Computers are also typically equipped with internal power supplies that are pre-wired to supply power to drives that may subsequently be installed in the bays. This wiring comprises power and ground wires that terminate in an industry-standard connector. This connector is of a design adapted to mate with a corresponding standard connector that is found on most disk drives.

Figure 1:
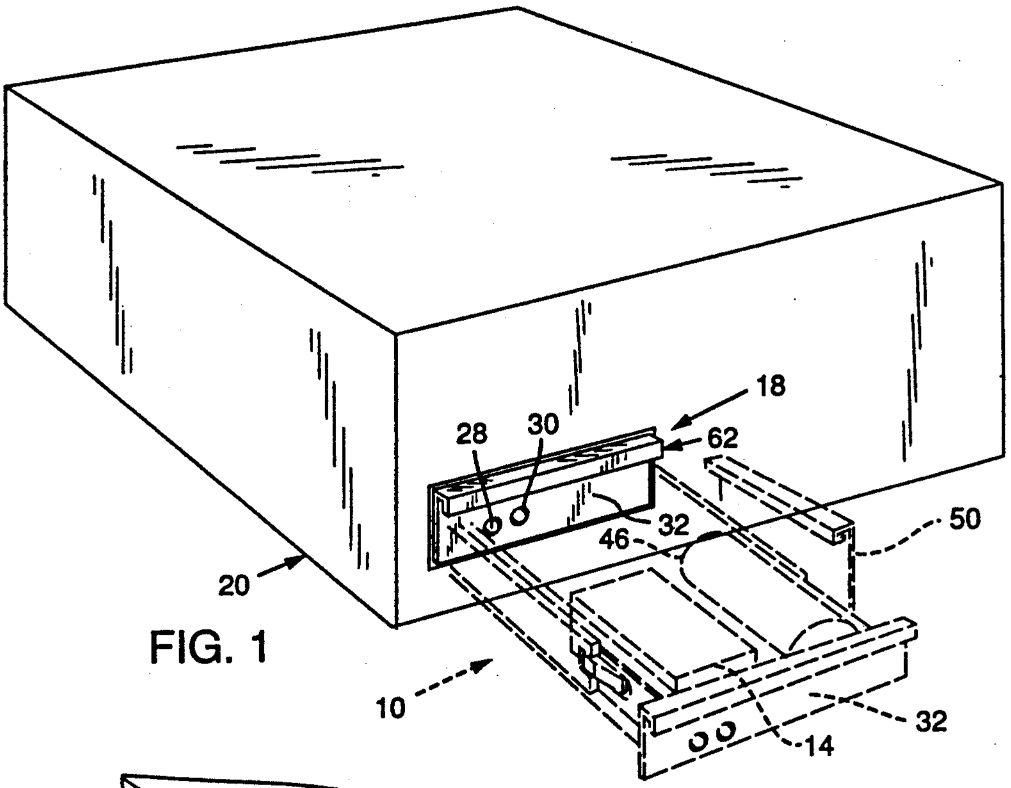
FIG. 1 is a perspective view showing a printer assembly according to the present invention installed in a drive bay of a computer.
Figure 2:
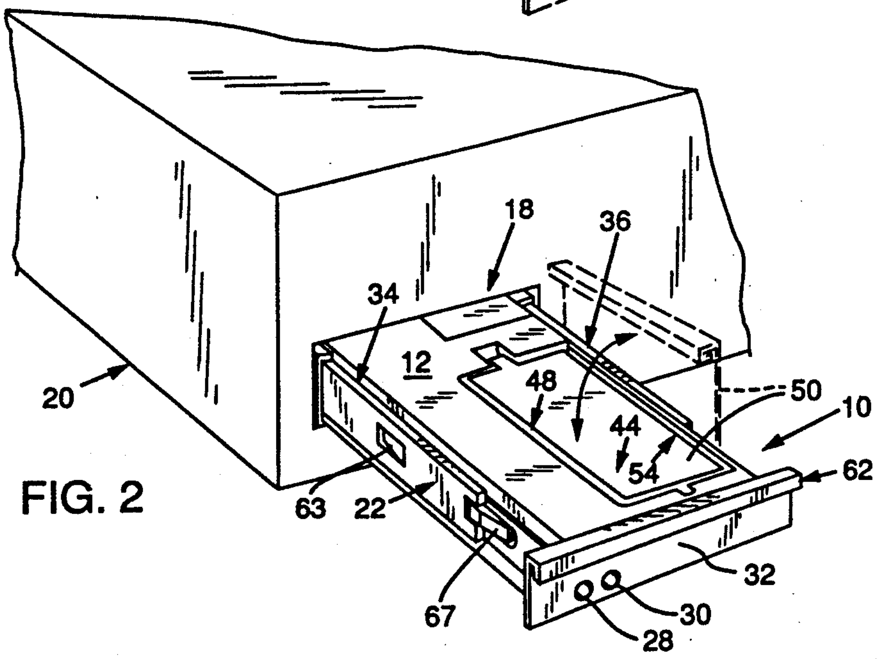
FIG. 2 is a perspective view showing the printer assembly of FIG. 1 in its extended position.
Figure 3:
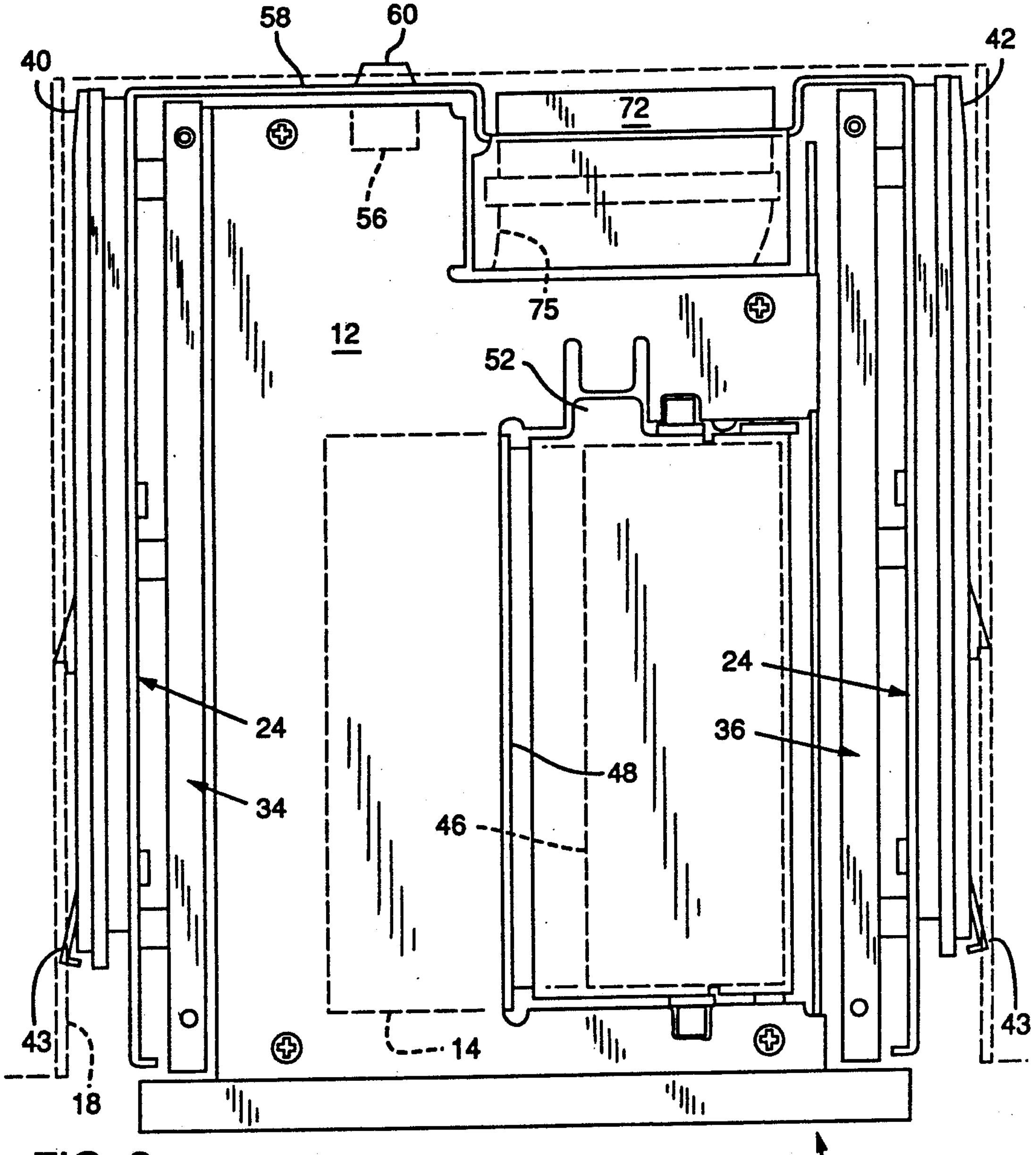
FIG. 3 is a top plan view of the printer assembly of FIG. 1 in its nested position within the case of a computer.
Figure 6:
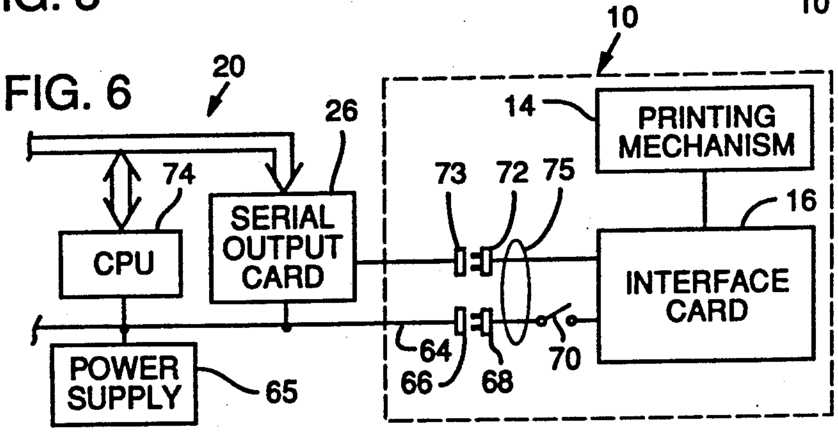
FIG. 6 is a partial schematic block diagram of a computer illustrating its interface to the printer assembly of FIG. 1.
Figure 4:
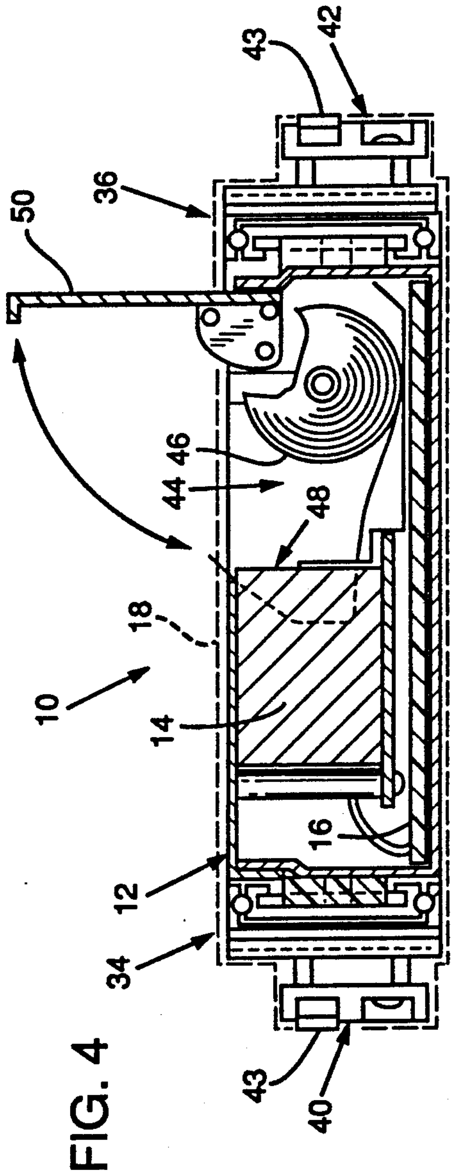
FIG. 4 is a section view of the printer assembly of FIG. 1.
Figure 5:
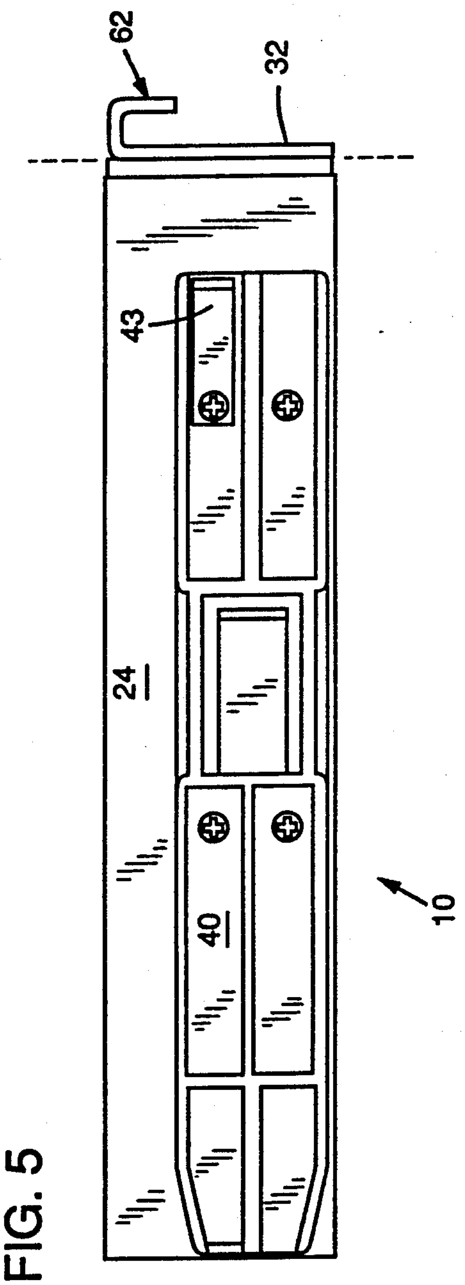
FIG. 5 is a side view of the printer assembly of FIG. 1.

Referring now to FIGS. 1–6, an exemplary printer assembly 10 includes an internal chassis 12 containing a printer mechanism 14 and an interface card 16, all adapted to be slidably mounted within a drive bay 18 of a computer 20 by a sliding mechanism 22 and an external chassis 24.

The illustrated printer 14 is a thermal printer, such as the Seiko STP411G-320, which can print 40 characters per line in normal mode and 80 characters per line in compressed mode. The interface card 16 interfaces the printer to an output port 26 of an associated computer 20. A suitable interface card is the Seiko IF 4112-GCB, which includes both serial and parallel inputs. (In the illustrated embodiment, a simplified version of the Seiko interface card is used and omits the parallel input port, since only one port is required.) The interface card drives an indicator LED 30 on a front panel 32 to indicate ON LINE. A pushbutton 28 operates the printer's line feed function.

The sliding mechanism 22 comprises left and right nested channel slide assemblies 34, 36 which couple the internal chassis 12 to the external chassis 24. The nested channel slide assemblies are commercially available from Grant Hardware Co. of West Nyack, N.Y. as part number 4435-8.

The external chassis 24 comprises an aluminum frame sized and shaped so the internal chassis 12 can nest therein. Attached to the sides of the frame are mounting rails 40, 42 which are dimensioned to cooperate with corresponding mechanical supports in the drive bay of the computer to facilitate mounting of the printer assembly 10 therein. The illustrated rails are designed to cooperate with mechanical supports used in a Hewlett-Packard computer. Those skilled in the art will recognize that different rails may be used to accommodate the requirements of different computers. Protruding from the rails are grounding tabs 43 that are used in the Hewlett-Packard drive bay to assure electrical continuity.

The internal chassis 12 is formed of sheet aluminum and defines an open chamber 44 in which a roll 46 of thermal paper rests. The thermal printing mechanism 14 is disposed along one edge 48 of this chamber, and paper from the roll 46 is routed therethrough. A paper cover door 50, having a lift tab 52, is hingedly mounted at the opposite edge 54 of this chamber to provide access to the printer.

A female latch element 56 is desirably mounted on a rear panel 58 of the internal chassis 12. This element cooperates with a male element 60 mounted in the rear of the external chassis 24 to hold the internal chassis nested therein. To extend the internal chassis from the external chassis, a user simply pulls on a grip 62 on the front panel 32, thereby separating the mated members and permitting the printer assembly 10 to be extended from its nested position. When the printer assembly is fully extended to its second position, latch members 63 on the sliding mechanism 22 engage to maintain the printer in this position. Release members 67 can be depressed to free the printer from its extended position and to permit sliding back to the nested position.

As noted, most computers include an internal power cable 64 adapted to provide power from an internal power supply 65 to disk drives that may be mounted in their drive bays. The connectors 66 used on such cables are generally standardized to facilitate connection to a variety of accessory disk drives. The external chassis 24 of the illustrated printer assembly 10 desirably includes a connector 68 (FIG. 6) on the rear panel 58 thereof adapted to mate with and receive power through such a cable.

The rear panel of the external chassis 24 is also equipped with a second connector 72 (FIGS. 3 and 6) adapted to receive serial data from a serial interface card 26 mounted in the computer. Again, the connectors 73 used with serial data cards are generally standardized, and the connector 72 on the rear panel of the printer is desirably adapted to mate with and receive data from such a standard connection. (In some computers, the processor board 74 contains a serial interface, so no serial card is needed.)

An umbilical cable 75 couples the power and data signals from the rear panel connectors 68 and 72 to a connector that mates with a connector on the interface card 16. The umbilical cable is designed to accommodate movement of the internal chassis 12 relative to the external chassis 24 when the printer is moved between its first and second positions.

In one embodiment of the invention, the sliding mechanism 22, when fully extended, closes a microswitch 70 on the interface card 16 that applies power to the interface circuitry and printer mechanism 14. By such an arrangement, power is applied to these elements only when the assembly is extended to its second position, ready for use. This interlock prevents inadvertent operation of the printer while nested within the case of the computer.

From the foregoing, it will be recognized that the provision of a printer as an integral part of a computer overcomes a great number of drawbacks that have hindered use of printers with portable/transportable/rack mount computers, and with computers used in applications where space is limited. For example, no longer must a printer and associated cabling accompany a transportable computer wherever a user contemplates a hard copy output might be required. Now, the computer itself can be equipped with a dedicated printer that is available when needed, and conveniently stored when it is not. Similarly, no longer must a user bother with connecting and disconnecting a printer to power and data each time it is required. Instead, these connections are made internally, ready at a moment's notice.

Having described and illustrated the principles of my invention with reference to a preferred embodiment, it will be apparent that the invention can be modified in arrangement and detail without departing from such principles. For example, while the invention has been illustrated with reference to an embodiment employing a thermal printer, it will be recognized that the principles of the invention are equally applicable to printers employing other technologies, such as ink jet, impact/-dot-matrix, xerographic, etc. Similarly, while the invention has been illustrated with reference to the mounting of a printer in a computer, it will be recognized that a variety of other electronic products can benefit from provision of a printer integrally therein. Exemplary are test instruments which include one or more drive bays to facilitate software programming of certain measurement routines. Still further, it will be recognized that the invention is not limited just to equipment that includes an industry standard drive bay. Rather, any cabinet or enclosure that has adequate space therein can be adapted to receive a printer mounting arrangement in accordance with the principles of this invention. Finally, while the invention has been illustrated with reference to an embodiment in which the printer assembly is slidably mounted in a drive bay, it will be recognized that in other embodiments the printer assembly can be fixedly mounted in such a bay. In such other embodiments, paper printed by the printer can be routed through an opening in the front panel. Rolls of paper can be installed either through a doorway in the front panel, or by withdrawing the assembly from the bay.

In view of the many possible embodiments to which the principles of my invention may be put, it should be recognized that the detailed embodiment is illustrative only and should not be taken as limiting the scope of my invention. Rather, I claim as my invention all such embodiments as may come within the scope and spirit of the following claims and equivalents thereto.

I claim:

1. In a method of operating an electronic apparatus with an associated printer, the apparatus including a case and a drive bay positioned therein, the drive bay being sized to receive an industry standard-sized disk unit, said industry standard size disk unit having front panel dimensions of approximately 5.5 or 3.5 inches in width and 1.75 or 3.5 inches in height, the drive bay further including mechanical supports adapted to receive and support an accessory apparatus within the drive bay, the method comprising providing power and data to the printer, an improvement comprising the steps:

mounting the printer on a supporting structure including first and second rails adapted to cooperate with the mechanical supports in the drive bay; and installing the printer and associated supporting structure within the drive bay by engaging the rails of the supporting structure with the mechanical supports in the drive bay.

2. An accessory for use with an electronic apparatus, the apparatus including a case and a drive bay positioned therein, the drive bay including mechanical supports positioned inside the case for receiving and supporting a disk drive having front panel dimensions of approximately 5.5 or 3.5 inches in width and 1.75 or 3.5 inches in height, the accessory comprising:

a printing mechanism;

a chassis on which the printing mechanism is mounted;

first and second rails affixed to first and second sides of the chassis and adapted to cooperate with the mechanical supports positioned inside the case;

wherein the accessory can be installed within the drive bay of the apparatus by engaging the rails on the chassis with the mechanical supports in the drive bay, thereby conveniently providing the apparatus with an integral printer.

3. In a method of operating an electronic apparatus with an associated printer, the apparatus including a case and a drive bay positioned therein, the drive bay being sized to receive an industry standard-sized disk unit, said industry standard size disk unit having front panel dimensions of approximately 5.5 or 3.5 inches in width and 1.75 or 3.5 inches in height, the method comprising providing power and data to the printer, an improvement comprising the steps:

mounting the printer on a mechanism mounted in the drive bay, said mechanism having a first position in which the printer is disposed within the case, concealed and secure from abuse, and a second position in which the printer is disposed outside the case and available for use.

4. The method of claim 3 which further includes sliding the mechanism from the first position to the second to make the printer available for use, and sliding the mechanism from the second position to the first when use of the printer is no longer required.

5. The method of claim 4 which further includes releasably securing the mechanism against unintended movement between the first and second positions.

6. The method of claim 3 which further includes providing power to the printer from a power supply disposed inside the case of the apparatus.

7. The method of claim 6 which further includes providing power to the printer when the mechanism is in the second position, but not when the mechanism is in the first position.

8. The method of claim 6 which further includes providing power to the printer from a power supply, through an internal connection, and through a connector that are each provided within the case of the apparatus and adapted to power a disk drive mounted in the drive bay.

9. The method of claim 6 which further includes providing power and data to the printer from the apparatus through an umbilical connection adapted to accommodate movement of the mechanism between the first and second positions.

10. The method of claim 9 which further includes:

sliding the mechanism from the first position to the second to make the printer available for use, and sliding the mechanism between the second position to the first when use of the printer is no longer required;

releasably securing the mechanism against unintended sliding from the first and second positions;

providing power to the printer from a power supply, through a internal connection, and through a connector that are each provided within the case of the apparatus and adapted to power a disk drive mounted in the drive bay; and providing power to the printer when the mechanism is in the second position.

11. An accessory for use with an electronic apparatus, the apparatus including a case and a drive bay positioned therein, the drive bay including mechanical supports positioned inside the case for receiving a disk drive having front panel dimensions of approximately 5.5 or 3.5 inches in width and 1.75 or 3.5 inches in height, the accessory comprising:

a printing mechanism;

a slide mechanism to which the printing mechanism is mounted;

a support structure for mounting the slide mechanism to the mechanical supports positioned inside the apparatus case;

said slide mechanism being adapted to slide the printing mechanism between a first position in which the printer is disposed within the case of the apparatus and a second position in which the printer is disposed outside the case.

12. The accessory of claim 11 in which the electronic apparatus comprises a computer.

13. The accessory of claim 11 which further includes mechanical holding means for releasably securing the slide mechanism against unintended movement between the first and second positions.

14. The accessory of claim 11 which further includes means for coupling power to the printer from a computer power supply.

15. The accessory of claim 11 which further includes a connector for receiving a power connector that is adapted to provide power to a disk drive.

16. The accessory of claim 11 which further includes means for providing power to the printer when the slide mechanism is in the second position but not when the slide mechanism is in the first position.

17. The accessory of claim 11 which further includes an umbilical connection adapted to accommodate movement of the printing mechanism on the slide mechanism between the first and second positions.

18. The accessory of claim 17 which further includes:

mechanical holding means for releasably securing the slide mechanism against unintended movement between the first and second positions;

means for coupling power to the printer from a computer power supply; and means for providing power to the printer when the slide mechanism is in the second position but not when the slide mechanism is in the first position.

19. An electronic apparatus comprising:

a case;

a power supply disposed within the case;

a processor board powered from the power supply;

a printing mechanism slidably mounted to the case and movable between a first position, in which the printing mechanism is disposed within the case and secure from abuse, and a second position in which the printing mechanism is disposed outside the case and available for use;

mechanical holding means for releasably securing the printing mechanism against unintended movement between the first and second positions;

means for coupling data to the printing mechanism from the processor board; and means for providing power to the printing mechanism from the power supply.

20. The apparatus of claim 19 which further includes means for preventing use of the printing mechanism when said mechanism is in the first position.

21. The apparatus of claim 20 in which said means for preventing use includes means for providing power to the printing mechanism when said mechanism is in the second position but not when said mechanism is in the first.

22. The apparatus of claim 21 in which the means for coupling data and for providing power to the printing mechanism includes an umbilical connection adapted to accommodate movement of the printing mechanism between the first and second positions.

23. The apparatus of claim 19 in which the means for coupling data and for providing power to the printing mechanism includes an umbilical connection adapted to accommodate movement of the printing mechanism between the first and second positions.

* * * * *